(12) United States Patent
Brintzinger

(10) Patent No.: US 6,495,918 B1
(45) Date of Patent: Dec. 17, 2002

(54) CHIP CRACK STOP DESIGN FOR SEMICONDUCTOR CHIPS

(75) Inventor: Axel Christoph Brintzinger, Fishkill, NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/655,461

(22) Filed: Sep. 5, 2000

(51) Int. Cl.[7] .......................... H01L 23/48; H01L 29/40; H01L 23/52
(52) U.S. Cl. .................. 257/758; 257/750; 257/692; 257/784
(58) Field of Search ................ 257/758, 750, 257/752, 692, 784

(56) References Cited

U.S. PATENT DOCUMENTS

| | | | |
|---|---|---|---|
| 5,739,587 A | * | 4/1998 | Sato |
| 5,789,302 A | * | 8/1998 | Mitwalsky et al. |
| 5,834,829 A | | 11/1998 | Dinkel et al. |
| 5,851,903 A | * | 12/1998 | Stamper |
| 5,917,197 A | | 6/1999 | Alswede et al. |
| 5,923,088 A | * | 7/1999 | Shiue et al. |
| 5,981,302 A | * | 11/1999 | Alswede et al. |
| 6,022,791 A | * | 2/2000 | Cook et al. |
| 6,025,639 A | * | 2/2000 | Mitwalsky et al. |
| 6,084,287 A | | 7/2000 | Mitwalsky et al. |
| 6,198,170 B1 | * | 3/2001 | Zhao |
| 2001/0005617 A1 | * | 6/2001 | Feurle et al. |

FOREIGN PATENT DOCUMENTS

| | | | |
|---|---|---|---|
| JP | 10-41255 | * | 2/1998 |
| JP | 10-84042 | * | 3/1998 |

* cited by examiner

Primary Examiner—Sheila V. Clark

(57) ABSTRACT

A semiconductor chip, in accordance with the present invention, includes a substrate and a crack stop structure. The crack structure includes a first conductive line disposed over the substrate and at least two first contacts connected to the substrate and to the first conductive line. The at least two first contacts are spaced apart from each other and extend longitudinally along a length of the first conductive line. A second conductive line is disposed over a portion of the first conductive line, and at least two second contacts are connected to the first conductive line and the second conductive line. The at least two second contacts are spaced apart from each other and extend longitudinally along a length of the second conductive line.

18 Claims, 8 Drawing Sheets

CHIP CRACK STOP DESIGN FOR SEMICONDUCTOR CHIPS

BACKGROUND

1. Technical Field

This disclosure relates to semiconductor fabrication, and more particularly, to a method for reducing the risk of cracks in semiconductor chips.

2. Description of the Related Art

Semiconductor chips are formed on a silicon wafer. The chips are placed adjacent to one another on the wafer, and after fabrication processes are completed, the wafer is diced by cutting the wafer along kerfs. This separates the chips from each other. The dicing processes may induce stress into the chips. This stress may cause stress cracks to form through the semiconductor chip structure. Cracks may also form due to latent stresses in the semiconductor chip structure. Cracks typically form along interfaces between, for example, metal structures and dielectric materials. Some portions of the semiconductor structures are particularly susceptible to crack propagation.

Referring to FIG. 1A, a partial cross-sectional view of a metal structure is shown in accordance with the prior art. A substrate 10 includes diffusion regions 12, which are part of devices or components, such as transistors, capacitors, resistors, etc. A first level contact 14 connects diffusion region 12 to a first metal line 16. First metal line 16 runs into and out of the plane of the page, and is employed, for example, in making connections between devices on the substrate level or to higher metal layers. Another contact 18 connects metal line 16 to a metal line 20, which also runs into and out of the plane of the page. Contact 22 is employed for making connections between metal line 20 and higher metal layers. In this case higher metal layers include a terminal via (TV) 24 which is connected to metal line 20 by a contact 22. Terminal via 24 is typically employed for providing a test probe contact area and an area for connecting lead wires for electrically connecting the chip to a leadframe for packaging the chip.

The structure shown in FIG. 1A is susceptible to crack propagation. Stresses present in the chip or induced by processes, such as dicing, causes cracks to propagate along the structure in areas 26. Cracks form at the interface between dielectric material 28, for example, silicon dioxide, and metal lines/contacts. Cracks, which propagate down to substrate 10, have the potential for causing chip failures over time. Cracks also expose metal lines and contacts to ambient environments, which can cause corrosion/oxidation which degrade chip performance.

Referring to FIG. 1B, a top view taken at section line 1B—1B of the prior art structure of FIG. 1A is shown. Contacts 14 (18 and/or 22) are circular in shape and contact a small area of metal lines (e.g., 16 and 20) and/or terminal via (24). This area mismatch lends itself to stress concentrations, which may be detrimental to the reliability of the chip over time.

Therefore, a need exists for an improved crack stop design, which provides additional contacts between metal lines with a different geometry. A further need exists for a crack stop design, which includes an air crack stop.

SUMMARY OF THE INVENTION

A semiconductor chip, in accordance with the present invention, includes a substrate and a crack stop structure. The crack structure includes a first conductive line disposed over the substrate and at least two first contacts connected to the substrate and to the first conductive line. The at least two first contacts are spaced apart from each other and extend longitudinally along a length of the first conductive line. A second conductive line is disposed over a portion of the first conductive line, and at least two second contacts are connected to the first conductive line and the second conductive line. The at least two second contacts are spaced apart from each other and extend longitudinally along a length of the second conductive line. The crack stop structure provides multiple contacts at each level to improve crack resistance.

Another semiconductor chip of the present invention, includes a substrate and a crack stop structure. The crack stop structure includes a first conductive line disposed over the substrate, and at least two first contacts are connected to the substrate and to the first conductive line. The at least two first contacts are spaced apart from each other and extend longitudinally along a length of the first conductive line. A second conductive line is disposed over a portion of the first conductive line, and at least two second contacts are connected to the substrate. The at least two second contacts are spaced apart from each other and extend longitudinally along a length of the first conductive line. A dielectric material surrounds the crack stop structure, and the dielectric material includes an air-filled trench over the second conductive line to improve crack growth resistance.

In alternate embodiments, the at least two first contacts may include three contacts. The at least two second contacts may include three contacts. The chip may include a dielectric material surrounding the crack stop structure, and the dielectric material may include an air-filled trench over the second conductive line. The second conductive line may include a terminal via for testing the chip.

The chip may further include a third conductive line disposed over a portion of the second conductive line, and at least two third contacts connected to the second conductive line and the third conductive line, the at least two third contacts being spaced apart from each other and extending longitudinally along a length of the third conductive line. The third conductive line may include a terminal via. The first and second metal lines and the at least two first contacts and the at least two second contacts may form a serpentine structure. The serpentine structure is preferably located adjacent to a dicing channel of the chip. The at least two first contacts and the at least two second contacts may extend over the entire length of the first metal line.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes a structures formed in semiconductor devices for reducing crack propagation. Cracks caused by latent stress or stress induced by dicing may lead to chip failures and reduced chip yield. The present invention increases crack stop resistance by employing additional lines of contacts instead of conventional single contacts. Further, a serpentine or staggered contact structure may be employed. The present invention also employs an air stop structure, which provides an air filled trench to reduce potential crack problems.

Figure 1A:
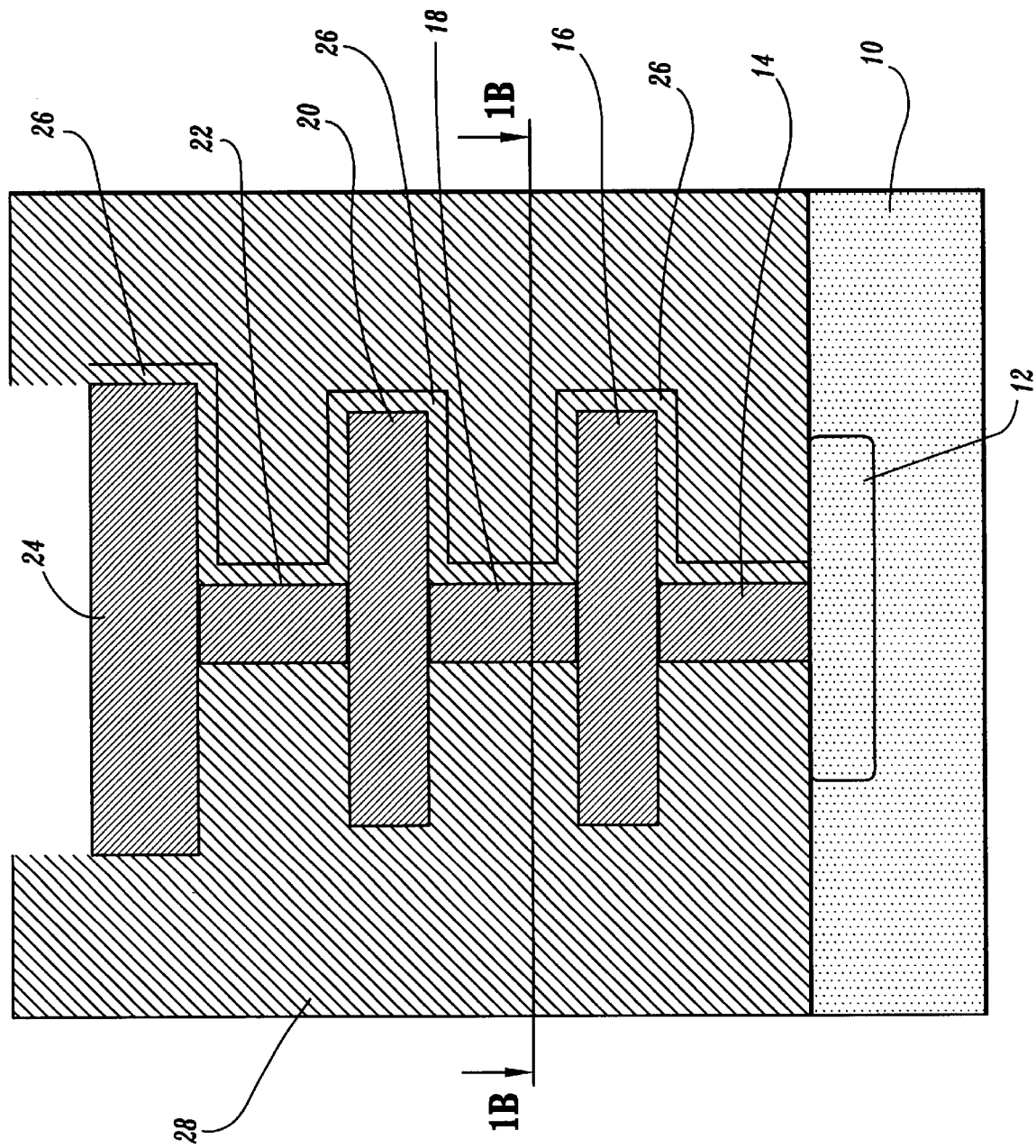
FIG. 1A is a partial cross-sectional view of a semiconductor chip in accordance with the prior art.
Figure 1B:
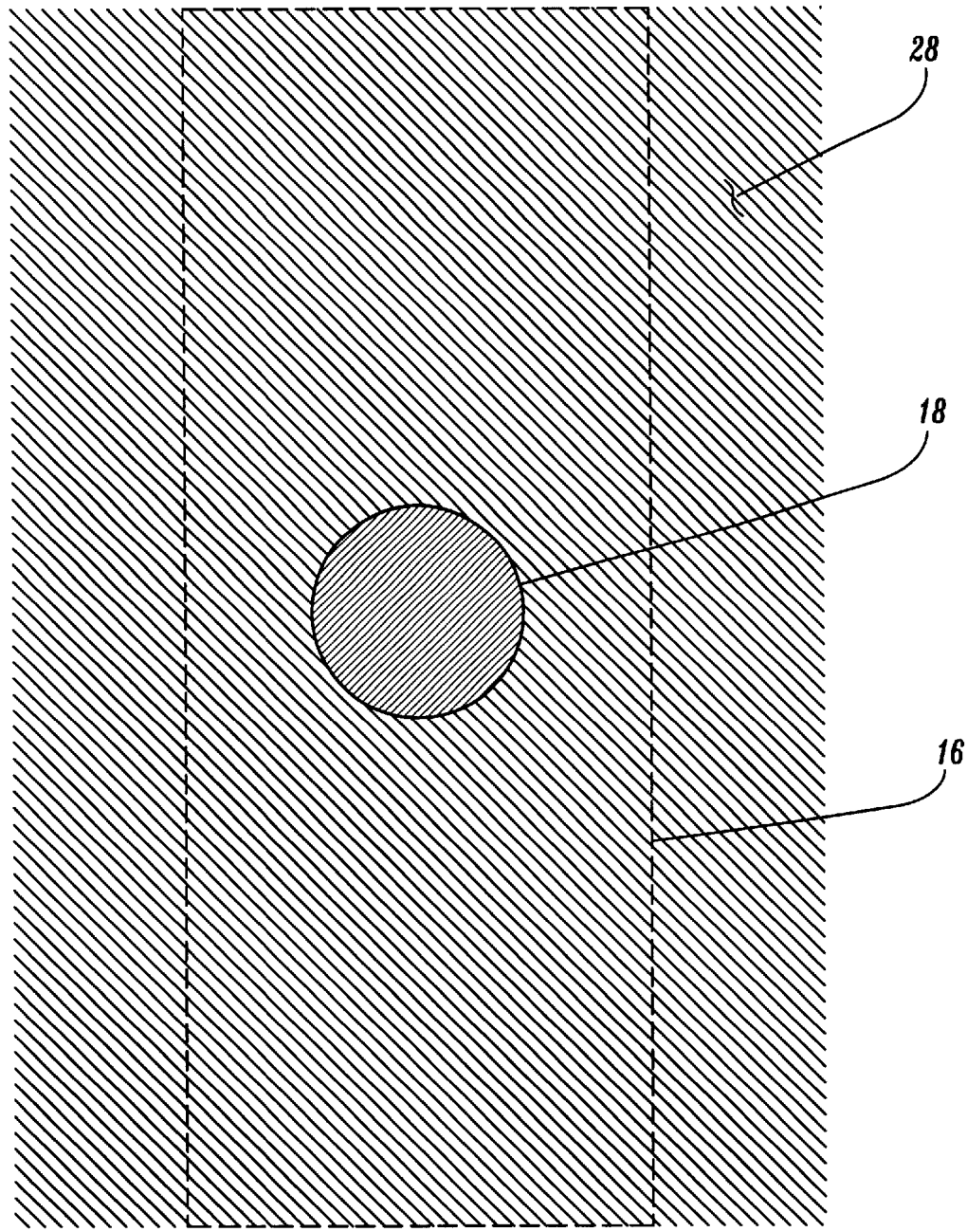
FIG. 1B is a cross-sectional top view taken at section line 1B—1B of the semiconductor chip of FIG. 1A in accordance with the prior art.
Figure 2:
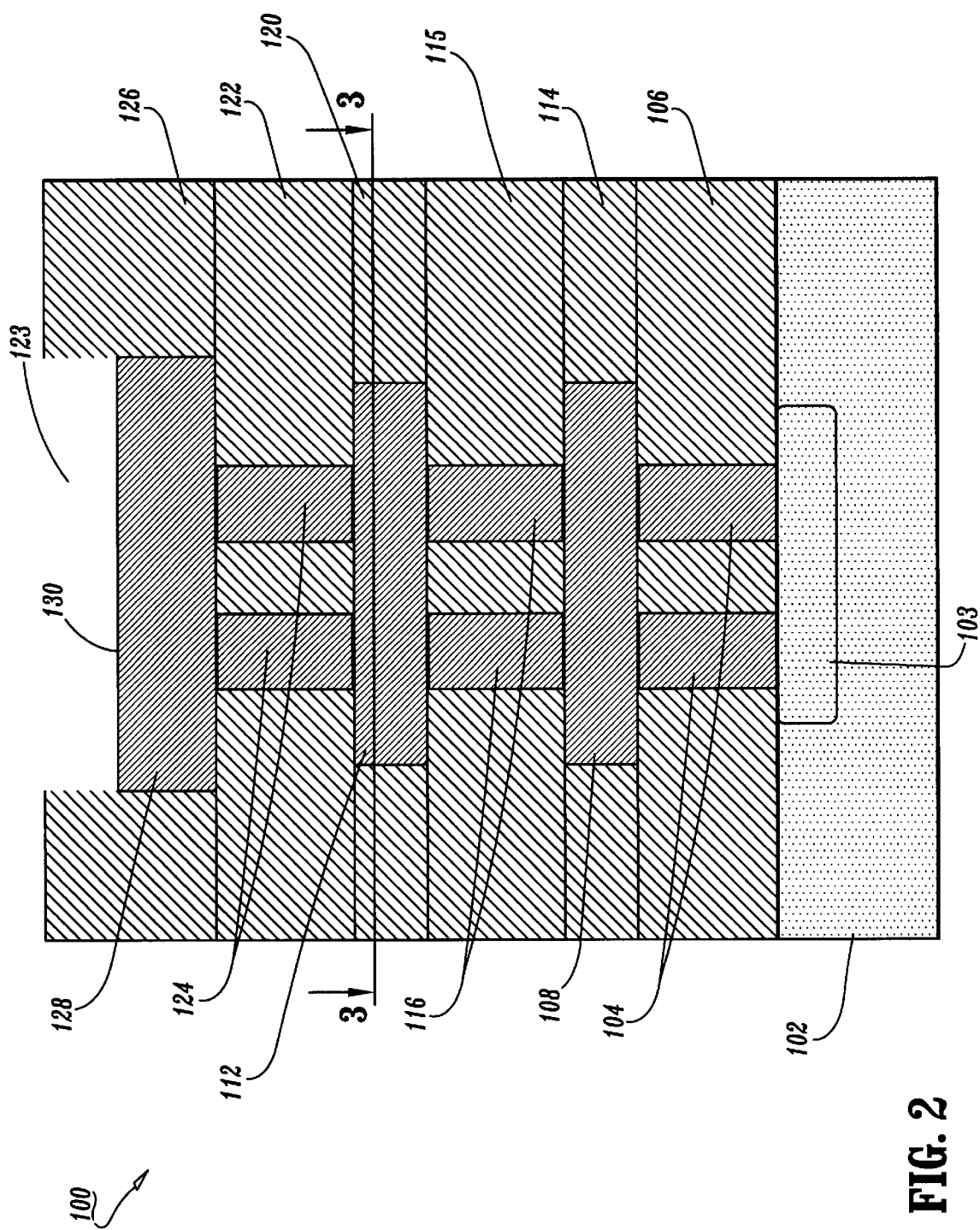
FIG. 2 is a partial cross-sectional view of a semiconductor chip with an improved crack stop structure in accordance with the present invention.

Referring now in specific detail to the drawings in which like reference numerals identify similar or identical elements throughout the several views, and initially to FIG. 2, a partial cross-sectional view of a semiconductor chip 100 is shown in accordance with one embodiment of the present invention. Semiconductor chip 100 may include a memory chip, such as, for example, a dynamic random access memory (DRAM) device, static RAM 5 (SRAM), synchronous DRAM (SDRAM), etc. Semiconductor chip 100 may also include embedded DRAM devices, processors, application specific chips, or any other semiconductor device.

Chip 100 includes a substrate 102. Substrate 102 may include mono-crystalline silicon, gallium arsenide, germanium, silicon-on-insulator (SOI) or any other substrate material. Substrate 102 is typically included on a wafer formed from substrate material. The wafer is processed to fabricate a plurality of chips 100, simultaneously, as is known in the art. Substrate 102 is doped and/or etched and filled to form a plurality of different devices 103 therein. For example, devices 103 may include transistors, capacitors, isolation trenches, resistors, inductors, diodes, or any other component or device employed with integrated circuits.

A dielectric layer 106 is formed over substrate 102 by known methods and patterned in accordance with the present invention. Contacts 104 are formed by patterning dielectric layer 106 to include two or more contacts to a same device or to different devices formed on substrate 102. In one embodiment, dielectric layer 106 includes and oxide, such as, silicon dioxide. Contacts 104 are preferably formed by depositing a metal, such as Aluminum, Tungsten Copper, etc. Contacts and/or metal lines may include diffusion barrier layers as are known in the art, for example, a thin layer of TaN may be deposited to line contact holes or metal line trenches prior to depositing metal.

Another dielectric layer 114 is deposited and patterned to form a trench for depositing metal line 108. Metal line 108 extends into and out of the plane of the page. Metal line 108 may be employed, for example, as a bitline in a memory device.

Another dielectric layer 115 is formed and patterned to create contact holes or trenches for forming contacts 116. Contacts 116 include two or more contacts, which connect to metal line 108. Yet another dielectric layer 120 is formed and patterned to create a trench for depositing a metal line 112. Metal line 112 runs into and out of the plane of the page, and connects to contacts 116. Dielectric layers 122 and 126 are similarly formed and patterned. Contacts 124 and metal line 128 are deposited to complete the structure. Advantageously, multiple lines of contacts are employed at each level of the structure to function as a crack stop structure. As described above edges of metal lines and contacts are preferably offset to increase surface area and reduce crack propagation risk. Metal lines 108, 112 and 128 and contacts 104, 116 and 124 are preferably formed from a metal, such as, for example, aluminum, tungsten, copper, etc. Alternately, contacts and metal lines may be formed from a conductive material, such as doped polysilicon. Dielectric layers may include an oxide, such as, silicon dioxide.

Metal line 128, preferably includes a terminal via (TV) 130 employed to connect chip 100 to chip packaging (not shown) and/or to provide a probe terminal for testing chip 100. A window 123 (TV window) is opened up to permit access to TV 130 to provide testing of the chip.

Figure 3A:
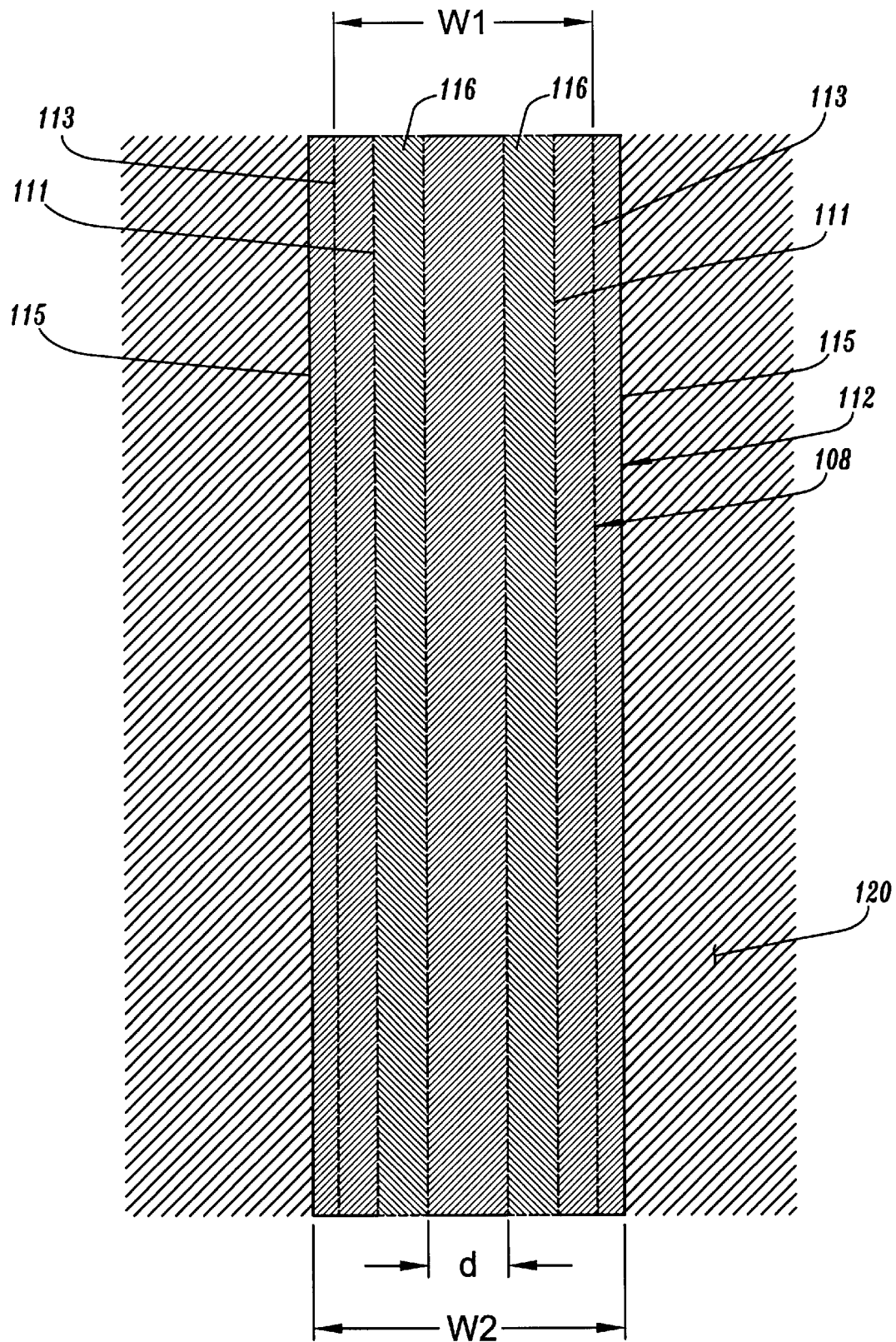
FIGS. 3A and 3B are top cross-sectional views of the semiconductor chip of FIG. 2 taken at section line 3—3 with continuous contacts (FIG. 3A) and separated contact portions (FIG. 3B) in accordance with the present invention.
Figure 3B:
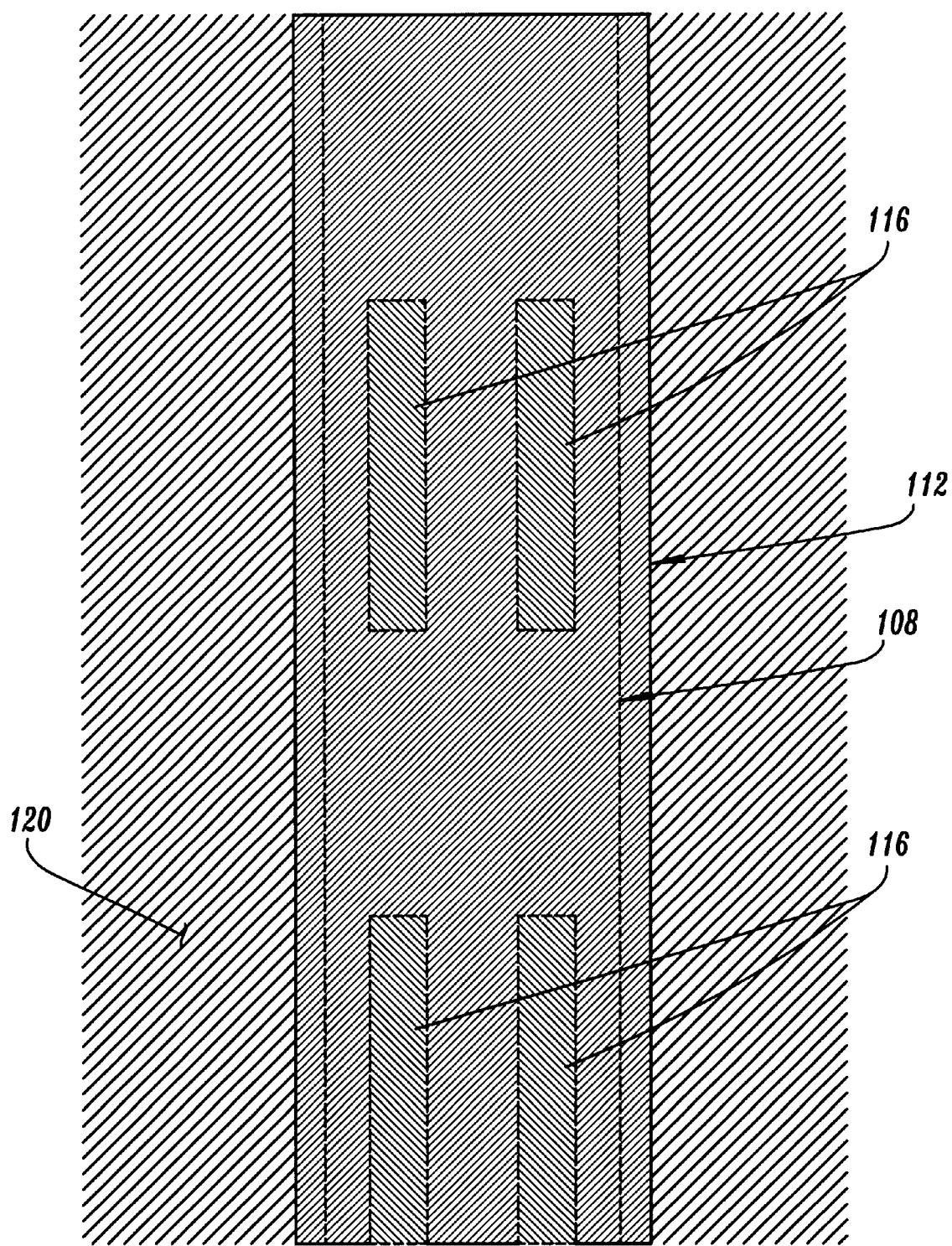

Referring to FIGS. 3A and 3B, a top view of chip 100 taken at section line 3—3 is shown. As illustratively shown in FIG. 3A, two contacts 116 are formed adjacent to one another, and longitudinally extend along metal lines 108 and 112. The present invention also contemplates employing more than two lines of contacts, if adjacent metal lines (e.g., between metal line 108 and 112) have a width (e.g., W1 or W2) sufficient to support these extra contacts, for example, as shown for contacts 222 in FIG. 4. Metal layers are preferably wider in comparison to the thin contact lines between each metal layer. One reason for this is to avoid a potential underfill of the contacts during fabrication. To improve the crack stop resistance further a second or even third line of contacts is employed (if they fit within the width (W1 and W2) of the upper (112) and lower metal (108) lines). Contacts 116 and metal line 108 are shown in phantom lines to indicate that the are below metal line 112.

Contacts 116 are spaced apart by a distance d. d may be adjusted to accommodate metal lines (above or below) or structures on substrate 102 which need to be electrically connected by contacts. It is preferable that distance d exists between contacts 116 to provide increased surface area between the dielectric layer (e.g., dielectric layers 106, 115, 122 of FIG. 2 and contacts 104, 116 and 124 of FIG. 2). The increased surface area aids in reducing the risk of crack propagation.

Metal line 108 is connected to contacts 116. Preferably, end surfaces 111 of contacts 116 are coincident with end surfaces 113 of metal line 108 (or end surfaces 115 of metal line 112). This misalignment permits additional surface area between the dielectric material surrounding the contacts and metal line(s), and reduces the risk of crack propagation through layers of the chip.

Figure 4:
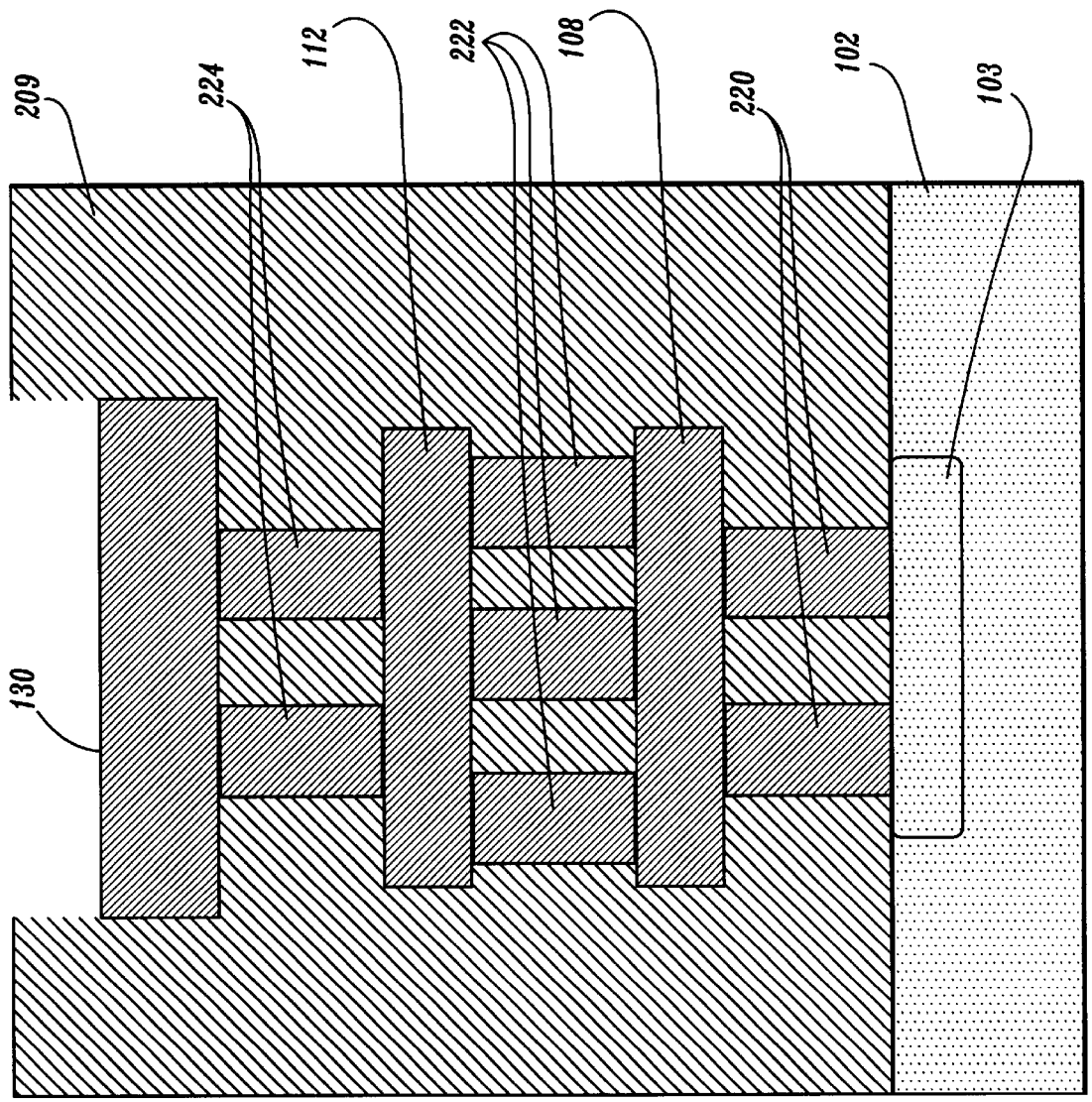
FIG. 4 is a partial cross-sectional view of a semiconductor chip having combinations of different numbers of contacts lines at different levels of the chip in accordance with another embodiment of the present invention.

It is to be understood that the number of contacts at each level may vary. For example, as shown in FIG. 4, a first level may include two lines of contacts 220, a next level may include three lines of contacts 222 and a third level may include two lines of contacts 224. A dielectric material 209 surrounds crack stop structure. Other combinations of numbers of contacts on each level or on different levels are also contemplated. It is further to be understood that the contacts extend along the longitudinal direction of the metal line in which the contacts are connected, as shown in FIGS. 3A and 3B. These contacts may extend over the entire length of the metal line (see, e.g., FIGS. 3A and 5) or over a small portion or portions (See FIG. 3B).

Figure 5:
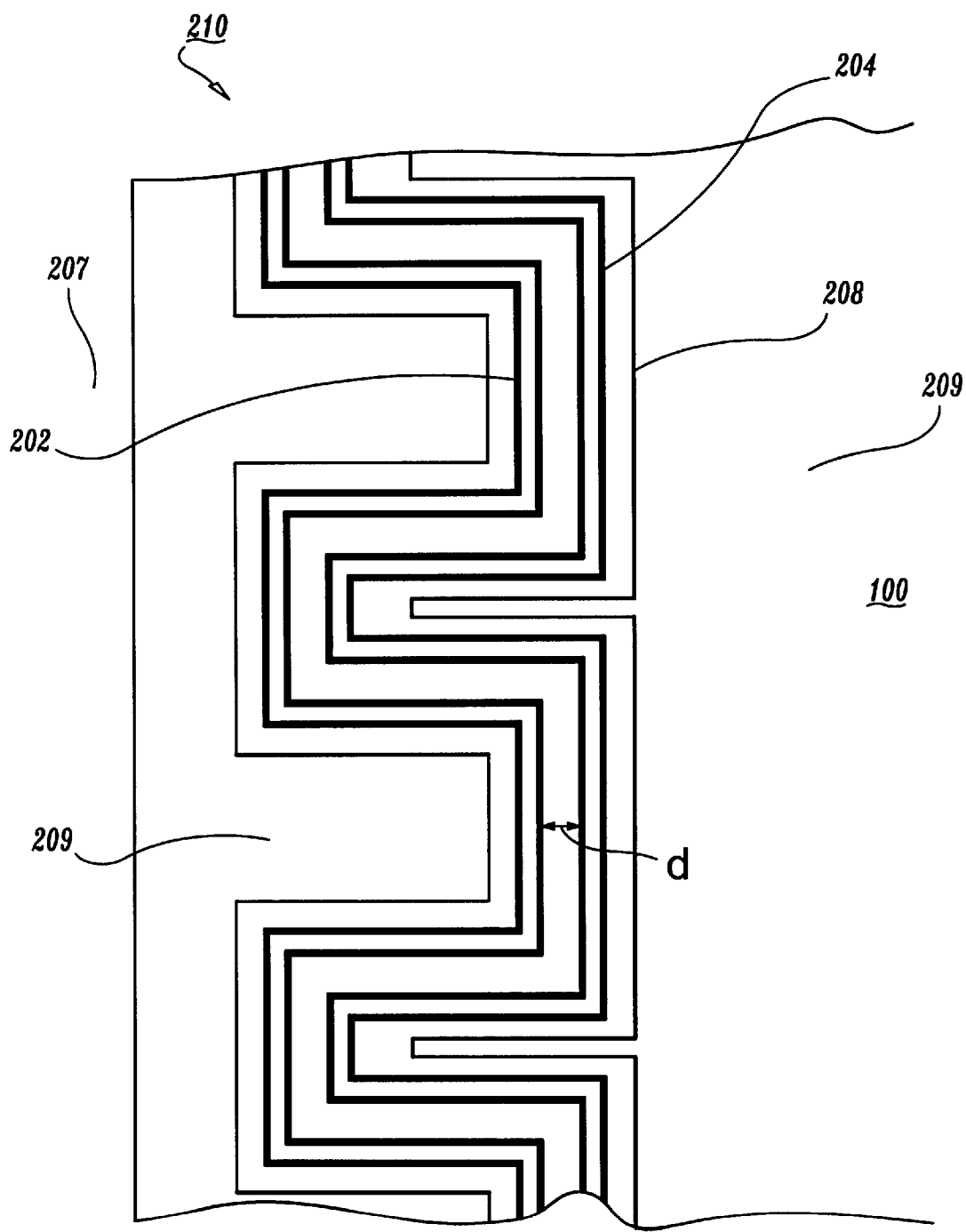
FIG. 5 is a top view of a semiconductor chip structure including a serpentine contact arrangement in accordance with the present invention.

Referring to FIG. 5, a top view of a metal line 208 and contacts 202 and 204 are shown with upper layers removed to reveal a serpentine pattern. In preferred embodiments, contacts are staggered or formed in a serpentine pattern. Contacts 202 and 204 are shown on top of metal line 208 for chip 100. In FIG. 5, metal lines 208 meander along the surface of chip 100, and contact 202 is offset from contact 204 by distance d. A dielectric material 209 surrounds crack stop structure 210. In a preferred embodiment, contacts 202 and 204 maintain a distance d between each other despite changes in dimensions of metal line 208. This serpentine arrangement reduces crack propagation risk and may be employed in conjunction with any and all of the embodiments of the present invention. In a preferred embodiment, the serpentine structure may be used at or near a dicing channel or kerf 207. In this way, the crack stop structure is employed at a location of highest risk of cracking. The serpentine structure may also be employed throughout the chip. Serpentine structure may include a regular periodicity or an irregular periodicity, and may accommodate structures or features chip 100 located nearby.

Figure 6:
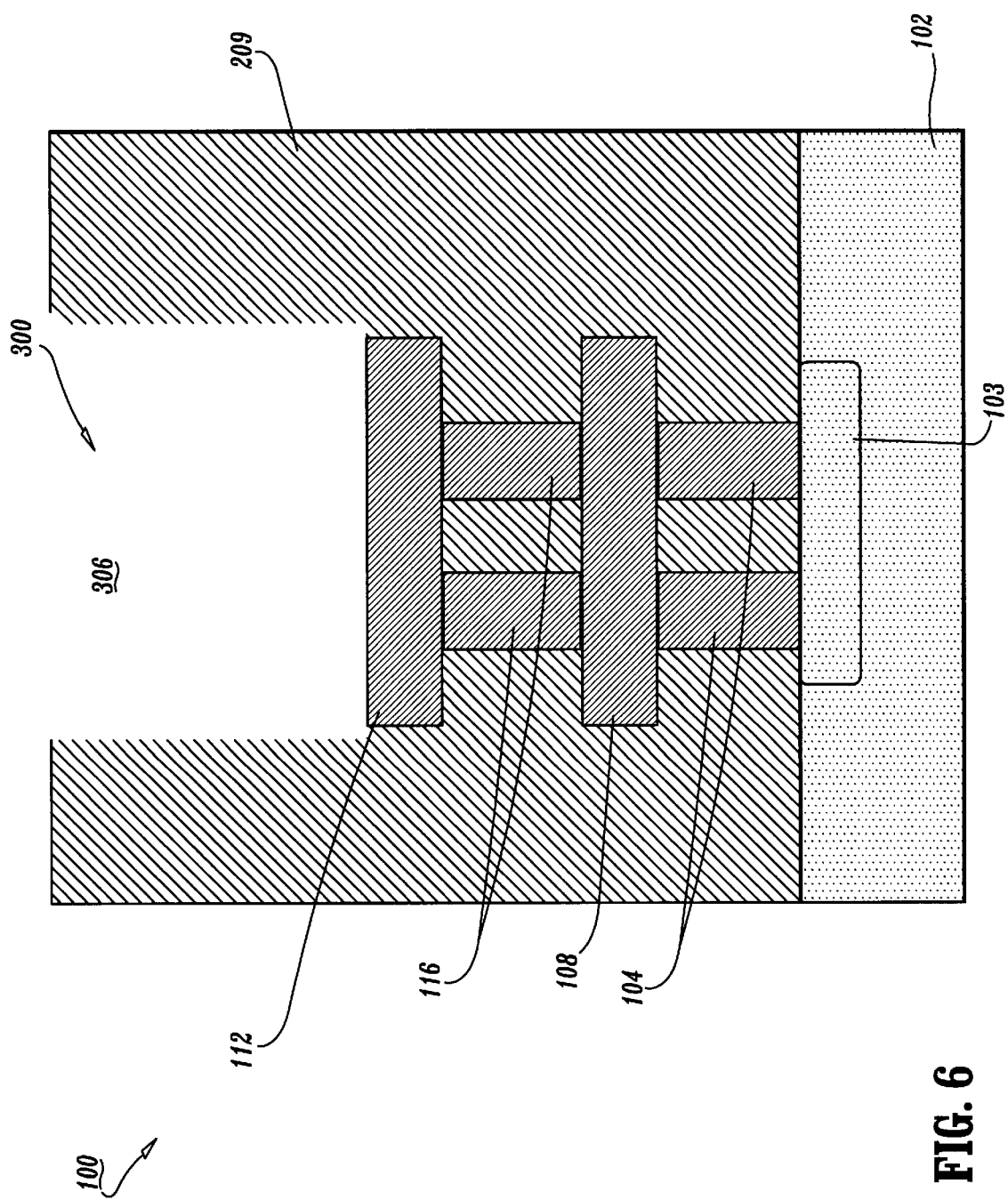
FIG. 6 is a partial cross-sectional view of a semiconductor chip with a semi-air/semi-metal crack stop structure in accordance with the present invention.

Referring to FIG. 6, a semi-metal/semi air filled crack stop 300 is shown in accordance with another preferred embodiment of the present invention. A terminal via etch may be employed to make part of a crack stop structure 300 filled with air (e.g., semi-metal/semi-air crack stop). Advantageously, a contact layer and a metal layer are eliminated from the structure (compare, e.g., FIG. 2). The depth, which would have been occupied by the eliminated contacts and metal line structure, is now occupied by air to form air crack stop 306. An air crack stop 306 improves the crack resistance significantly. As compared to FIG. 2, the structure of FIG. 6 eliminates metal line 128 and contacts 124 to permit a TV etch down to metal line 112. Metal line 112 now functions as a terminal via. The TV etch is employed to etch away a portion of the metal of metal line 112 so that there is no concern of remaining oxide on top of metal line 112. This etch process may include a TV etch which is employed to remove passivation from laser fuses.

Having described preferred embodiments for improved chip crack stop design for semiconductor chips (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor chip, comprising:
   a substrate; and
   a crack stop structure comprising:
      a first conductive line disposed over the substrate;
      at least two first contacts connected to the substrate and to the first conductive line, the at least two first contacts being spaced apart from each other and extending longitudinally along a length of the first conductive line;
      a second conductive line disposed over a portion of the first conductive line; and
      at least two second contacts connected to the first conductive line and the second conductive line, the at least two second contacts being spaced apart from each other and extending longitudinally along a length of the second conductive line; and
      wherein said first and second contacts are of substantially greater longitudinal dimension than lateral dimension.

2. The chip as recited in claim 1, wherein the at least two first contacts includes three contacts.

3. The chip as recited in claim 1, wherein the at least two second contacts includes three contacts.

4. The chip as recited in claim 1, further comprising a dielectric material surrounding the crack stop structure.

5. The chip as recited in claim 4, wherein the dielectric material includes an air-filled trench over the second conductive line.

6. The chip as recited in claim 4, wherein the second conductive line includes a terminal via.

7. The chip as recited in claim 1, further comprising:
   a third conductive line disposed over a portion of the second conductive line; and
   at least two third contacts connected to the second conductive line and the third conductive line, the at least two third contacts being spaced apart from each other and extending longitudinally along a length of the third conductive line.

8. The chip as recited in claim 7, wherein the third conductive line includes a terminal via.

9. The chip as recited in claim 1, wherein the first and second metal lines and the at least two first contacts and the at least two second contacts form a serpentine structure.

10. The chip as recited in claim 9, wherein the serpentine structure is located adjacent to a dicing channel of the chip.

11. The chip as recited in claim 1, wherein the at least two first contacts and the at least two second contacts extend over the entire length of the first metal line.

12. A semiconductor chip, comprising:
   a substrate; and
   a crack stop structure comprising:
      a first conductive line disposed over the substrate;
      at least two first contacts connected to the substrate and to the first conductive line, the at least two first contacts being spaced apart from each other and extending longitudinally along a length of the first conductive line;
      a second conductive line disposed over a portion of the first conductive line;
      at least two second contacts connected to the substrate, the at least two second contacts being spaced apart from each other and extending longitudinally along a length of the first conductive line; and
      a dielectric material surrounding the crack stop structure, the dielectric material including an air-filled trench over the second conductive line; and
      wherein said first and second contacts are of substantially greater longitudinal dimension than lateral dimension.

13. The chip as recited in claim 12, wherein the at least two first contacts includes three contacts.

14. The chip as recited in claim 12, wherein the at least two second contacts includes three contacts.

15. The chip as recited in claim 12, wherein the second conductive line includes a terminal via.

16. The chip as recited in claim 12, wherein the first and second metal lines and the at least two first contacts and the at least two second contacts form a serpentine structure.

17. The chip as recited in claim 16, wherein the serpentine structure is located adjacent to a dicing channel of the chip.

18. The chip as recited in claim 12, wherein the at least two first contacts and the at least two second contacts extend over the entire length of the first metal line.

* * * * *

UNITED STATES PATENT AND TRADEMARK OFFICE
CERTIFICATE OF CORRECTION

PATENT NO. : 6,495,918 B1
DATED : December 17, 2002
INVENTOR(S) : Axel Brintzinger It is certified that error appears in the above-identified patent and that said Letters Patent is hereby corrected as shown below:

<u>Title page,</u>
Item [73], Assignee, "Infineon Technologies AG, Munich (DE); International Business Machines Corporation, Armonk, NY (US)" should read -- Infineon Technologies AG, Munich (DE) --

Signed and Sealed this

Ninth Day of November, 2004

JON W. DUDAS
*Director of the United States Patent and Trademark Office*